(12) United States Patent
Meguro et al.

(10) Patent No.: US 7,955,434 B2
(45) Date of Patent: *Jun. 7, 2011

(54) DIAMOND SINGLE CRYSTAL SUBSTRATE

(75) Inventors: Kiichi Meguro, Itami (JP); Yoshiyuki Yamamoto, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1407 days.

This patent is subject to a terminal disclaimer.

(21) Appl. No.: 11/055,973

(22) Filed: Feb. 14, 2005

(65) Prior Publication Data
US 2005/0211159 A1 Sep. 29, 2005

(30) Foreign Application Priority Data

Mar. 24, 2004 (JP) ................................. 2004-085930

(51) Int. Cl.
*C30B 29/04* (2006.01)
(52) U.S. Cl. ................ 117/86; 117/89; 117/94; 117/95; 117/96
(58) Field of Classification Search ............... 117/86, 117/89, 94, 95, 96
See application file for complete search history.

(56) References Cited

U.S. PATENT DOCUMENTS
5,753,038 A 5/1998 Vichr et al.
2005/0155543 A1* 7/2005 Meguro et al. .................. 117/75

FOREIGN PATENT DOCUMENTS
| EP | 1 555 337 A2 | 7/2005 |
| JP | 3-75298 | 3/1991 |
| JP | 2003-277183 A | 10/2003 |

OTHER PUBLICATIONS

Posthill, J.B., et al. "Demonstration of a method to fabricate a large-area diamond single crystal," Thin Solid Films, Dec. 15, 1995, pp. 39-49, vol. 271, No. 1/2, Elsevier-Sequoia S.A., Lausanne.
Jiang X., et al. "Deposition of heteroepitaxial diamond films on 2 in silicon substrates," Diamond and Related Materials, Apr. 1996, pp. 251-255, vol. 5, No. 3-5, Elsevier Science Publishers, Amsterdam.
European Search Report in Application No. EP 0525803.3 dated Sep. 12, 2005.

(Continued)

*Primary Examiner* — Robert M Kunemund
(74) *Attorney, Agent, or Firm* — McDermott Will & Emery LLP

(57) ABSTRACT

A diamond single crystal substrate obtained by a vapor-phase growth method, wherein the diamond intrinsic Raman shift of the diamond single crystal substrate surface measured by microscopic Raman spectroscopy with a focused beam spot diameter of excitation light of 2 μm is deviated by +0.5 cm$^{-1}$ or more to +3.0 cm$^{-1}$ or less from the standard Raman shift quantity of strain-free diamond, in a region (region A) which is more than 0% to not more than 25% of the surface, and is deviated by −1.0 cm$^{-1}$ or more to less than +0.5 cm$^{-1}$ from the standard Raman shift quantity of strain-free diamond, in a region (region B) of the surface other than the region A. The diamond single crystal substrate can be obtained with a large size and high-quality without cracking and is suitable for semiconductor materials, electronic components, and optical components or the like.

8 Claims, 2 Drawing Sheets

OTHER PUBLICATIONS

Posthill, J.B., et al. "Demonstration of a method to fabricate a large-area diamond single crystal," Thin Solid Films, Dec. 15, 1995, pp. 39-49, vol. 271, No. 1/2, Elsevier-Sequoia S.A., Lausanne.

Jiang X., et al. "Deposition of heteropitaxial diamond films on 2 in silicon substrates," Diamond and Related Materials, Apr. 1996, pp. 251-255, vol. 5, No. 3-5, Elsevier Science Publishers, Amsterdam.

* cited by examiner

DIAMOND SINGLE CRYSTAL SUBSTRATE

BACKGROUND OF THE INVENTION

1. Field of the Invention

The present invention relates to a diamond single crystal substrate, and more particularly to a large, high-quality diamond single crystal substrate suitable for semiconductor materials, electronic components, and optical components or the like.

2. Description of the Prior Art

Diamond, like no other material, has a large number of excellent characteristics as a semiconductor material, those characteristics including high thermal conductivity, high electron and hole mobility, high insulation breakdown field, low dielectric loss, and a wide band gap. In particular, UV light-emitting devices using a wide band gap of diamond and field-effect transistors having excellent high-frequency characteristic. etc. have been developed in recent years. Moreover, because diamond is transparent within a range from ultraviolet (UV) to infrared (IR) regions, it is also promising as an optical component material.

In order to use diamond as a semiconductor, similarly to other semiconductor materials, large, high-quality single crystal substrates are required. Presently, diamond single crystals are industrially obtained mainly by a high-temperature high-pressure synthesis method. The crystallinity of the single crystals thus obtained is superior to that of naturally produced single crystals, but the size is difficult to increase above 10 mm in diameter and nitrogen is present as an impurity in the crystals unless special growth conditions are employed. The nitrogen-containing substrates are difficult to use directly as semiconductor single crystals. Moreover, due to absorption inherent to nitrogen, such substrates are not suitable as window materials for UV rays. Accordingly, an attempt was made to obtain a large, high-purity single crystal substrate by using the aforementioned substrate as a seed substrate for vapor phase growth and to conduct homoepitaxial growth (for example, Japanese Patent Publication Nos. 3-75298A and 2003-277183A).

When a diamond single crystal was homoepitaxially grown on a diamond single crystal seed substrate obtained by high-pressure synthesis, a phenomenon of residual stress accumulation in the vapor-phase grown layer was confirmed (for example, Japanese Patent Publication No. 2003-277183A). When a diamond single crystal substrate is obtained by forming a single crystal thick film by vapor phase growth, a problem of substrate cracking due to stress accumulation is encountered. Because the probability of cracking increases with the increase in substrate size (increase in surface area and thickness), this problem is not resolved even when a method described in Japanese Patent Publication No. 3-75298A is used, this method comprising the steps of forming a substrate serving as a nucleus for vapor phase growth by disposing a plurality of substances with a high-pressure phase that have substantially identical crystal orientation, growing a single crystal on this substrate by a vapor phase growth method, and obtaining an integrated large single crystal. Furthermore, the problems encountered during thick film growth are substantially not resolved even by conducting vapor phase growth of diamond single crystals from a seed substrate with a thickness of 100 μm or less, as described in Japanese Patent Publication No. 2003-277183A.

SUMMARY OF THE INVENTION

The present invention was created to overcome the aforementioned drawbacks and it is an object thereof to provide a large, high-quality diamond single crystal substrate suitable for semiconductor materials, electronic components, and optical components.

In order to resolve the above-described problems, the present invention has the following aspects (1) to (7).

(1) A diamond single crystal substrate obtained by a vapor-phase growth method, wherein the diamond intrinsic Raman shift of the diamond single crystal substrate surface measured by microscopic Raman spectroscopy with a focused beam spot diameter of excitation light of 2 μm is deviated by +0.5 cm$^{-1}$ or more to +3.0 cm$^{-1}$ or less from the standard Raman shift quantity of strain-free diamond, in a region (region A) which is more than 0% to not more than 25%, in area, of the surface, and is deviated by −1.0 cm$^{-1}$ or more to less than +0.5 cm$^{-1}$ from the standard Raman shift quantity of strain-free diamond, in a region (region B) of the surface other than the region A.

(2) The diamond single crystal substrate according to above (1), wherein the surface area of the region A is from 0.1% or more to 10% or less of the surface.

(3) The diamond single crystal substrate according to above (1) or (2), wherein the full width at half maximum of the diamond intrinsic Raman peak in the region A is from 2.0 cm$^{-1}$ or more to 3.5 cm$^{-1}$ or less, and the full width at half maximum of the diamond intrinsic Raman peak in region B is from 1.6 cm$^{-1}$ or more to 2.5 cm$^{-1}$ or less.

(4) A diamond single crystal substrate obtained by vapor-phase growth from a diamond single crystal seed substrate, wherein the diamond intrinsic Raman shift measured by setting the microfocus point on the interface of a seed substrate layer and a vapor-phase grown layer by the microscopic Raman spectroscopy with a focused beam spot diameter of excitation light of 2 μm is deviated by −1.0 cm$^{-1}$ or more to less than −0.2 cm$^{-1}$ from the standard Raman shift quantity of strain-free diamond, in a region (region C) which is more than 0% to not more than 25%, in area, of the interface, and is deviated by −0.2 cm$^{-1}$ or more to +0.2 cm$^{-1}$ or less from the standard Raman shift quantity of strain-free diamond, in a region (region D) of the interface other than the region C.

(5) The diamond single crystal substrate according to above (4), wherein the surface area of the region C is from 0.1% or more to 10% or less of the interface.

(6) The diamond single crystal substrate according to any of above (1) to (5), having a diameter of 10 mm or more.

(7) The diamond single crystal substrate according to any of above (4) to (6), obtained by vapor-phase growth from a diamond single crystal seed substrate, wherein prior to vapor-phase growth, the surface layer of the seed substrate is etched away by reactive ion etching and then vapor-phase growth is conducted.

DETAILED DESCRIPTION OF THE PREFERRED EMBODIMENTS

Figure 1:
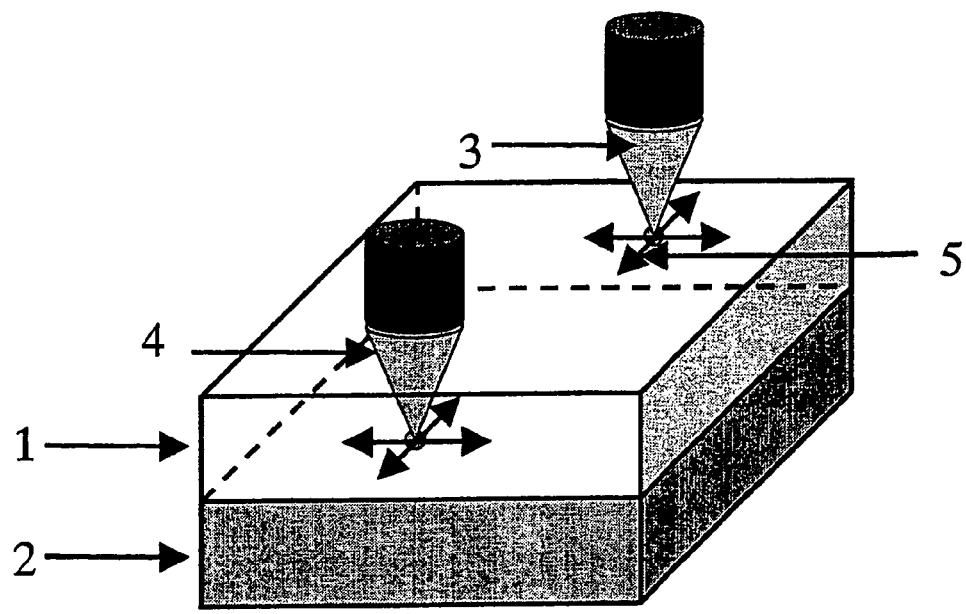
FIG. 1 is a schematic diagram illustrating Raman spectroscopy measurements of the example of the present invention.

The above-described present invention will be explained below.

By using a microscopic Raman spectroscope capable of measuring a two-dimensional surface distribution, the inventors have analyzed in detail the phenomenon of stress accumulation in homoepitaxial growth of diamond. The results obtained demonstrated that in the Raman shift distribution on the growth surface of a single crystal thin film there is sometimes an area with a deviation of several $cm^{-1}$ in both directions from 1332 $cm^{-1}$, which is the standard Raman shift of diamond. Because the Raman shift is caused by the natural frequency of a crystal lattice, in the region with a deviation from the standard shift inherent to diamond, the crystal lattice is strained by contraction or expansion with respect to the usual state. Here, it was found that when the homoepitaxial growth is further continued, the single crystal is frequently cracked when the surface area of the strain region measured by the initial Raman shift measurements is above a fixed value, or when the Raman shift quantity in this region exceeds a certain threshold value, or when the half width of the Raman peak exceeds a certain range. This finding led to the creation of the present invention.

Thus, a diamond single crystal substrate in accordance with the present invention is a substrate obtained by a vapor-phase growth method, wherein the diamond intrinsic Raman shift of the diamond single crystal substrate surface measured by microscopic Raman spectroscopy with a focused beam spot diameter of excitation light of 2 μm is deviated by +0.5 $cm^{-1}$ or more to +3.0 $cm^{-1}$ or less from the standard Raman shift quantity of strain-free diamond, in a region (region A) which is more than 0% to not more than 25%, in area, of the surface, and is deviated by –1.0 $cm^{-1}$ or more to less than +0.5 $cm^{-1}$ from the standard Raman shift quantity of strain-free diamond, in a region (region B) of the surface other than the region A. Because the deviation quantity from the standard Raman shift quantity indicates the size (intensity) of strains and the surface area thereof corresponds to the strain region, the inventors assumed that the cracking probability of a single crystal substrate can be represented by a function thereof and have experimentally clarified that this probability is correlated with the Raman shift quantity and the surface area thereof. Thus, if the Raman shift quantity and region are within the above-described range, the substrate can be used as a large, high-quality diamond single crystal substrate suitable for semiconductor and optical applications. Moreover, a single crystal thick film having no cracks can be also formed by homoepitaxial growth using this substrate as a seed substrate.

The area of the region A as defined above by Raman shift may be more than 0% to not more than 25% of the surface, preferably 10% or less, even more preferably 3% or less. Generally, the smaller is this region, the lower is the probability of cracking in the subsequent homoepitaxial growth. The results of a detailed study demonstrated that if this strain region A is too small, the probability of cracking sometimes increases due to local strain concentration. Thus, it is desirable that the region A be present at least on 0.1% of the surface. The shift quantity in the region A may be +0.5 $cm^{-1}$ or more to +3.0 $cm^{-1}$ or less from the standard Raman shift of strain-free diamond, preferably +0.5 $cm^{-1}$ or more to +2.0 $cm^{-1}$ or less, even more preferably +0.5 $cm^{-1}$ or more to +1.0 $cm^{-1}$ or less. The maximum shift quantity in the region A most often appears in the most strained region in the crystal, and the smaller is the numerical value thereof, the smaller are the strains. Therefore, the probability of cracking decreases. However, for the same reason as the increase in cracking probability observed when the surface area of the region A becomes too small, in order to cause strain relaxation in the entire crystal, it is necessary that the region with a deviation quantity of +0.5 $cm^{-1}$ or more be on the crystal surface. Thus, in accordance with the present invention, the aforementioned designated region with a deviation quantity of +0.5 $cm^{-1}$ or more is defined as the region A.

The region B as defined above by Raman shift is a portion appearing as a counteraction to compressive strains of the region A. The shift quantity therein may be –1.0 $cm^{-1}$ or more to less than +0.5 $cm^{-1}$ from the standard Raman shift quantity of the strain-free diamond, preferably –0.5 $cm^{-1}$ or more to less than +0.5 $cm^{-1}$. In the portion deviated toward a lower wavenumber side from the standard shift, tensile strains are accumulated and when the quantity of the deviation to the lowest wavenumber is less than –1.0 $cm^{-1}$, the probability of cracking increases. Conversely, the closer the numerical value to 0 $cm^{-1}$, the smaller are the strains, and the probability of cracking decreases. Therefore, a crack-free single crystal thick film can be also formed by homoepitaxial growth using this substrate as a seed substrate.

The full width at half maximum of the diamond intrinsic Raman peak in the region A is preferably 2.0 $cm^{-1}$ or more to 3.5 $cm^{-1}$ or less, and that of the region B is preferably 1.6 $cm^{-1}$ or more to 2.5 $cm^{-1}$ or less. The full width at half maximum of the Raman peak is a numerical value that reflects crystallinity, and generally smaller values indicate a better crystal quality. In the region A, compressive strains are present. Therefore, the full width at half maximum expands with respect to that of strain-free crystal. However, in the above-described numerical range, cracks are absent and the crystal can be used as a high-quality semiconductor. The aforementioned numerical range is preferred. At smaller numerical values, the probability of cracking increases due to strain diffusion, and at larger numerical values the crystal is difficult to use as a high-quality semiconductor due to degradation of crystallinity. In the region B, the full width at half maximum expands due to a counteraction to strains generated in the region A, but within the above-described numerical range, the substrate can be readily used as a high-quality single crystal substrate for semiconductors or the like.

The above-described diamond single crystal substrate can be obtained by homoepitaxial growth from a diamond single crystal seed substrate, as a representative method, but may be also obtained by heteroepitaxial growth from a different seed substrate or may be a single crystal substrate obtained by other vapor-phase growth methods. In the case of homoepitaxial growth, the Raman measurements may be conducted after the single crystal is grown by a vapor-phase growth method on a diamond single crystal seed substrate or after the seed substrate has been removed, for example, by polishing.

Furthermore, the diamond single crystal substrate in accordance with the present invention is a diamond single crystal substrate obtained by a vapor-phase growth from a diamond single crystal seed substrate, wherein the diamond intrinsic Raman shift of the diamond single crystal substrate surface measured by setting the microfocus point on the interface of a seed substrate layer and a vapor-phase grown layer in the microscopic Raman spectroscopy with a focused beam spot diameter of excitation light of 2 μm is deviated by –1.0 $cm^{-1}$ or more to less than –0.2 $cm^{-1}$ from the standard Raman shift quantity of strain-free diamond in a region (region C) which is more than 0% to not more than 25% of the interface, and is deviated by –0.2 $cm^{-1}$ or more to +0.2 $cm^{-1}$ or less from the standard Raman shift quantity of strain-free diamond in a region (region D) of the interface other than the region C.

The inventors have employed the above-described microscopic Raman spectroscopy during homoepitaxial growth of diamond and measured the Raman shift distribution by setting the microfocus point on the interface of the seed substrate layer and vapor-phase grown layer. The results demonstrated that at the interface directly below the aforementioned region A, the shift was toward a lower wavenumber side with respect to the standard Raman shift quantity of diamond and the correlation between this deviation quantity, region surface area, and cracking was confirmed. Thus, the region C of the Raman shift may be 25% or less of the interface, preferably 10% or less, more preferably 3% or less. Generally, the smaller is this region, the lower is the probability of cracking in the subsequent homoepitaxial growth. The results of a detailed study demonstrated that if this strain region C is too small, the probability of cracking increases due to local strain concentration. Thus, it is desirable that the region C be present at least on 0.1% of the measurement interface. The shift quantity in the region C may be $-1.0\ cm^{-1}$ or more to less than $-0.2\ cm^{-1}$ from the standard Raman shift of strain-free diamond, preferably $-0.5\ cm^{-1}$ or more to less than $-0.2\ cm^{-1}$.

In the region C, tensile strains accumulate as a counteraction to compressive strains in region A, and when the quantity of the deviation to the lowest wavenumber is $-1.0\ cm^{-1}$ or less, the probability of cracking increases. Conversely, the closer is the numerical value to $-0.2\ cm^{-1}$, the smaller are the strains, and the probability of cracking decreases. Therefore, a crack-free single crystal thick film can be also formed by homoepitaxial growth using this substrate as a seed substrate. However, if the region with a deviation quantity of less than $-0.2\ cm^{-1}$ disappears from the interface, the probability of cracking increases due to strains in the entire crystal. Therefore, the region with a deviation quantity of less than $-0.2\ cm^{-1}$ is necessary in the crystal interface to relax the strains. Thus, in the present invention, the aforementioned designated region with a deviation quantity of less than $-0.2\ cm^{-1}$ is defined as a region C. Further, in the region D, which is a measurement region other than the region C, the deviation quantity may be of $-0.2\ cm^{-1}$ to $+0.2\ cm^{-1}$ from the standard Raman shift quantity of strain-free diamond.

The aforementioned regions A and C may be within the above-described ratios in terms of the measurement region area of Raman distribution, but it is preferred that individual regions be dispersed and present as portions of small surface area. When the regions A and C concentrate in one region on the surface or interface, strain concentration causes cracking easier than in the case where the regions are dispersed, while having the same surface area.

If the diamond single crystal substrate in accordance with the present invention satisfies the conditions placed on the Raman shift distribution, and the diameter of the diamond single crystal is 10 mm or more, it is especially promising as a large single crystal substrate for optical applications. In the present specification, the diameter is the length of a longest line that can be drawn inside a single crystal of a certain size and shape.

A microwave plasma chemical vapor deposition (CVD) method, direct current (DC) plasma CVD method, and other well-known growth methods can be used as vapor-phase growth methods for synthesizing the single crystal in accordance with the present invention. When a diamond single crystal substrate is homoepitaxially grown by those growth methods, it is preferred that the surface layer of the diamond single crystal seed substrate be etched away in advance by reactive ion etching and then a single crystal be vapor phase grown. It is desirable that the surface of the single crystal seed substrate for vapor phase growth be mechanically polished, but the polished surface includes processing-modified layers comprising metal impurities and processing defects that are detrimental for single crystal vapor-phase growth. Those processing-modified layers can be removed by reactive ion etching prior to crystal growth and a high-quality diamond single crystal can be obtained, this single crystal having strains dispersed to a degree causing no cracking.

The reactive ion etching can be implemented by well-known methods. Such methods can be generally classified into methods using capacitively coupled plasma (CCP) where a high-frequency power source is connected to electrodes arranged opposite each other in a vacuum vessel and methods using inductively coupled plasma (ICP) where a high-frequency power source is connected to a coil disposed so as to be wound around a vacuum vessel. There are also methods that are combinations of the aforementioned methods. Any of such methods can be used in accordance with the present invention. A mixed gas of oxygen and carbon fluoride is used as the etching gas in reactive ion etching, and the etching pressure is preferably 1.33 Pa or more to 13.3 Pa or less. Using the above-mentioned gas and pressure makes it possible to remove the processing-modified layer rapidly and to obtain a flat surface. Further, the appropriate etching thickness is 0.5 μm or more to 50 μm or less and the substrate temperature during etching is 800 K or less, preferably 600 K or less. Conducting etching under such conditions increases the crystallinity of the diamond single crystal substrate obtained in subsequent vapor phase growth.

A well-known light source such as a laser can be used as the excitation light source in the microscopic Raman spectroscopy in accordance with the present invention, but the diameter of the focused light on the substrate surface or on the interface of the seed substrate layer and grown layer has to be 2 μm. Generally, when a gas laser or solid laser is used as the light source, the aforementioned focused light diameter can be realized with a lens with a microscopic (object) magnification of 100. The aforementioned focused light diameter can be also realized with a combination of variable pin holes or slits, rather than with the lens. The focused light illumination energy density of the excitation light may assume any value, but the process has to be implemented at an energy density (differs depending on the wavelength) which does not damage the diamond. Any wavelength from ultraviolet to infrared range can be used as the wavelength of the light source, but when the Raman spectroscopy measurements are conducted on the interface of the seed substrate layer and grown layer, it is necessary to introduce the excitation light from the grown layer side and to measure the Raman shift. Therefore, a wavelength that is not absorbed by the grown layer has to be selected. The wavelength resolution of the Raman spectroscope used in accordance with the present invention may be $2.0\ cm^{-1}$ or less in terms of a full width at half maximum of the Rayleigh scattering light peak under 514.5 nm light emission by an argon laser. The full width at half maximum and wavenumber of the Raman shift peak in accordance with the present invention are found by fitting with a Gaussian-Lorentzian function. When the surface distribution of Raman shift is measured, the measurement area is sectioned in a lattice form with a pitch of 5 μm or less, the Raman shift in the sections is measured, and the deviation quantity is plotted on a plane. Because the deviation quantity between the sections can be evaluated by interpolation, surface area of the respective regions can be found.

The present invention can provide a crack-free diamond single crystal substrate which can be used as a large and high-quality diamond single crystal substrate for semiconductor materials, electronic components, and optical components.

The present invention will be described hereinbelow in grater details based on examples thereof.

EXAMPLES

In Example 1, an example is considered in which homoepitaxial growth was conducted from a diamond single crystal seed substrate obtained by high-temperature high-pressure synthesis and a vapor-phase growth diamond single crystal substrate was obtained. The seed substrate had a square shape with length and a width of 8 mm (diameter 11.2 mm) and a thickness of 0.3 mm, and the main surface and side surfaces thereof were mechanically polished. The plane orientations of the main surface and all the side surfaces were {100}. First, the surface layer of the main surface of the seed substrate was etched away by reactive ion etching of the well-known type in which high-frequency discharge was induced between the electrodes. The etching conditions are shown in Table 1.

TABLE 1

| | |
|---|---|
| High-frequency wave frequency: | 13.56 MHz |
| High-frequency wave power: | 300 W |
| Pressure inside chamber: | 6.67 Pa |
| Flow rate of $O_2$ gas: | 10 sccm |
| Flow rate of $CF_4$ gas: | 10 sccm |
| Substrate temperature: | 550 K |
| Etching time: | 1 hour |

When etching was conducted under the conditions of Table 1, the main surface of the seed substrate was removed by 0.6 μm in thickness by etching.

Then, a single crystal was homoepitaxially grown on the seed substrate by a known microwave plasma CVD method. The growth conditions are shown in Table 2.

TABLE 2

| | |
|---|---|
| High-frequency wave frequency: | 2.45 GHz |
| High-frequency wave power: | 5 kW |
| Pressure inside chamber: | $1.33 \times 10^4$ Pa |
| Flow rate of $H_2$ gas: | 100 sccm |
| Flow rate of $CH_4$ gas: | 5 sccm |
| Substrate temperature: | 1200 K |
| Etching time: | 20 hours |

As a result of the growth, a diamond single crystal substrate with a thickness of the vapor-phase grown single crystal layer of 0.1 mm was obtained.

The surface distribution measurements of Raman shift were conducted under the conditions shown in Table 3 with respect to the diamond single crystal substrate thus obtained and the interface of the seed substrate layer and the grown layer.

TABLE 3

| | |
|---|---|
| Excitation light source: | Second harmonic wave of LD excitation YAG laser |
| Wavelength: | 532 nm |
| Focused beam spot diameter: | 2 μm |
| Wavelength resolution: | 1.6 $cm^{-1}$ (at 523 nm Rayleigh scattering light) |
| Focused beam illumination energy: | 10 mW |
| Measurement points: | substrate surface, interface of seed substrate and grown layer, lattice with a pitch of 5 μm |

The schematic drawing of the measurements is shown in FIG. 1. In FIG. 1, the reference numeral 1 stands for the vapor-phase grown layer of the diamond single crystal substrate, 2—the seed substrate layer of the diamond single crystal substrate, 3—a laser light source for Raman spectroscopy (surface measurements), 4—a laser light source for Raman spectroscopy (measurements on the interface of the seed substrate and the grown layer), and 5—is a scanning direction of Raman distribution measurements.

Figure 2:
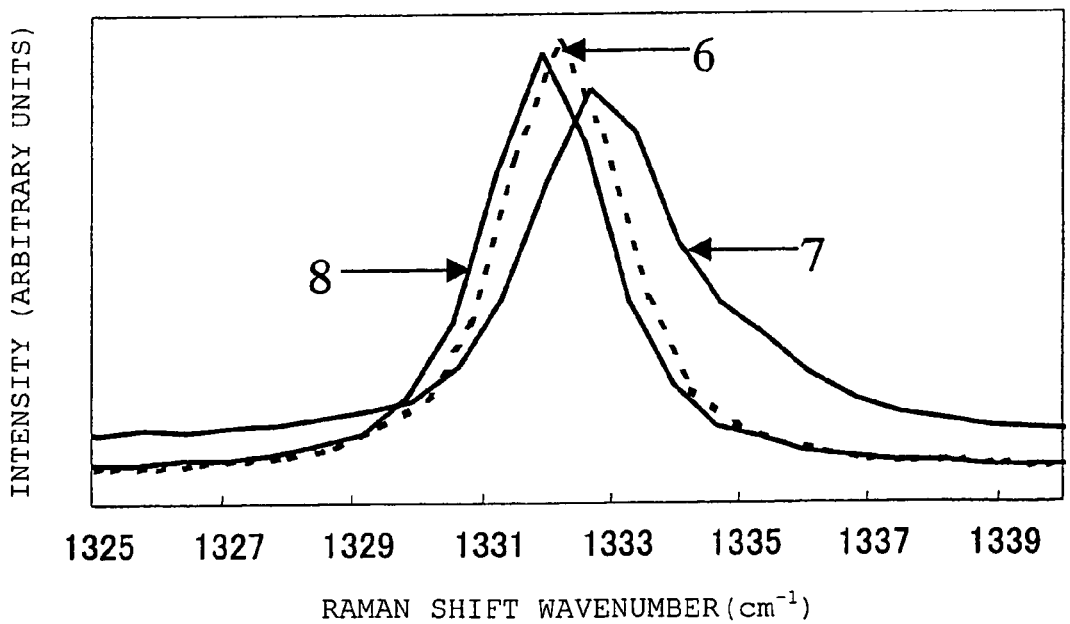
FIG. 2 is an example of the Raman spectrum measured in the example of the present invention.

An example of representative Raman spectrum measured under the conditions shown in Table 3 is shown in FIG. 2. In the figure, the reference numeral 6 stands for an example of a standard Raman spectrum, 7—an example of Raman spectrum of region A, and 8—an example of Raman spectrum of region C. As shown in FIG. 2, a region was observed with a deviation toward a higher wavenumber side from 1332 $cm^{-1}$, which is the standard shift quantity of strain-free diamond, on the grown surface. Conversely, a region with a deviation toward a lower wavenumber side from 1332 $cm^{-1}$ was observed on the interface of the seed substrate layer and grown layer.

Figure 3:
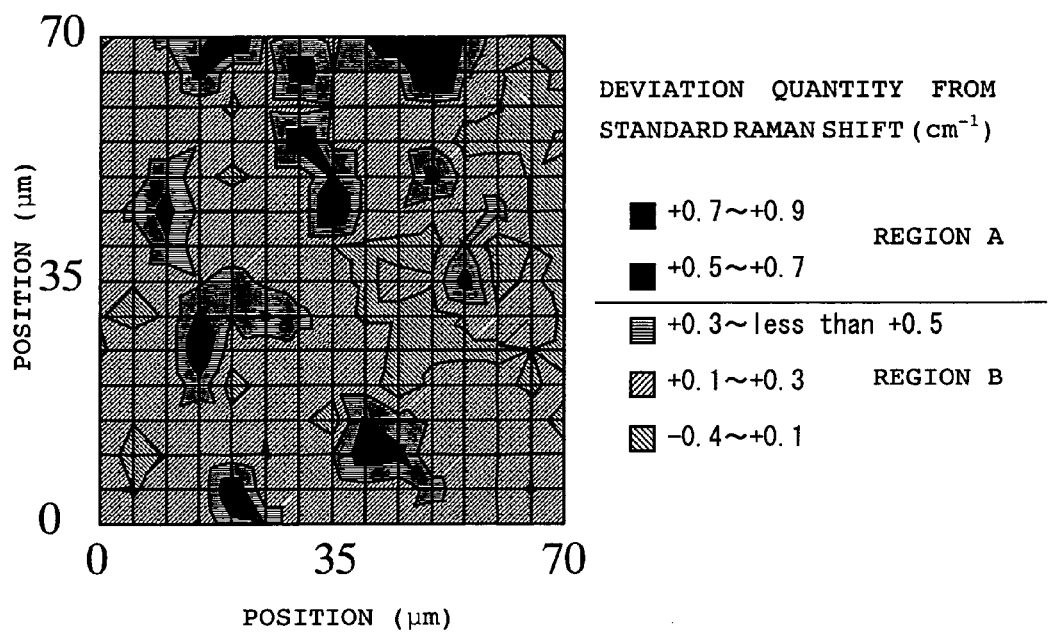
FIG. 3 is an example of the Raman shift distribution on the surface of the example of the present invention.
Figure 4:
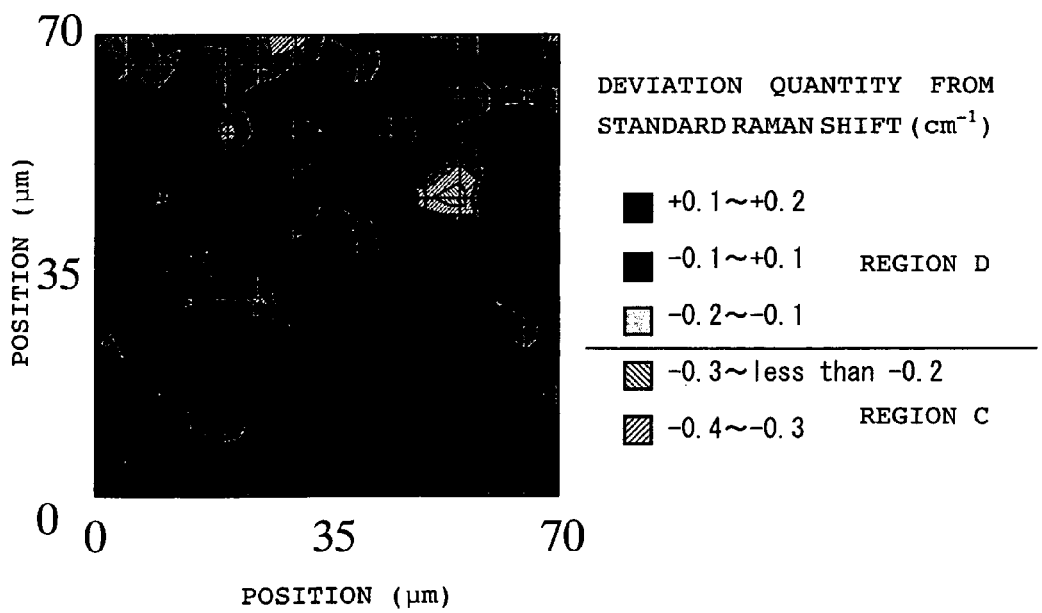
FIG. 4 is an example of the Raman shift distribution on the growth interface of the example of the present invention.

Here, the peak wavenumber was found by fitting with a Gaussian-Lorentzian function with respect to the measured Raman shift peaks, and the deviation quantity distribution from the standard shift quantity was found. FIG. 3 shows an example of measured distribution in a partial region (70 μm×70 μm) of the substrate surface, and FIG. 4 shows a distribution in a partial region (70 μm×70 μm) of the interface of the seed substrate layer and grown layer. As shown in FIG. 3, in the region (region A) that is part of the surface, comparatively large compressive strains were observed at a deviation quantity of +0.5 to +0.8 $cm^{-1}$ from the diamond standard shift, and in the remaining region (region B), practically no strains were present at a deviation quantity of −0.4 to +0.4 $cm^{-1}$. Further, as shown in FIG. 4, in the region (region C) that is part of the interface, comparatively large tensile strains were observed at a deviation quantity of −0.4 to −0.3 $cm^{-1}$ from the diamond standard shift, and in the remaining region (region D), practically no strains were present at a deviation quantity of −0.2 to +0.2 $cm^{-1}$. The entire surface of the single crystal substrate was evaluated by this method; the surface area proportions of the obtained regions A, B, C, D were 0.5%, 99.5%, 0.3%, and 99.7%, respectively. Furthermore, the full width at half maximum of the Raman peak of region A was 2.1-2.6 $cm^{-1}$, and that of region B was 1.7-2.4 $cm^{-1}$.

Then, additional homoepitaxial growth with a growth time of 80 hours was conducted under the same conditions as those of Table 2 with respect to the diamond single crystal substrate obtained by the above-described method. As a result, the total thickness of the vapor-phase grown single crystal layer was 0.5 mm. Then, the surface distribution of Raman shift was measured under the conditions identical to those of Table 3 and a shift distribution similar to the above-described distribution was measured. In order to avoid mixing up the two distributions, the newly measured regions were assigned with symbols ('). The deviation quantity from the standard shift quantity in regions A', B', C', D' was +0.5 to +1.0 $cm^{-1}$, −0.5 to +0.4 $cm^{-1}$, −0.5 to −0.3 $cm^{-1}$, and −0.2 to +0.2 $cm^{-1}$, and the respective surface area proportions were 2.9%, 97.1%, 1.4%, and 98.6%. Further, the full width at half maximum of the Raman peak of the region A' was 2.4 to 3.4 $cm^{-1}$ and that of region B' was 2.0 to 2.5 $cm^{-1}$. The deviation quantity (strain quantity) of the Raman shift, surface area of deviation regions (regions A', C'), and full width at half maximum of the peaks in the additional growth increased by comparison with those of the initial growth and measurements, and the single crystal substrate could be grown without cracking. Further, the seed substrate portion was mechanically removed from the grown single crystal substrate by polishing and the optical transmission spectrum thereof was measured. A transmittance of 60% or more was demonstrated from the absorption and of 225 nm to a near-IR region over the entire crystal surface and a high-quality single crystal was obtained. Those results confirmed that the diamond single crystal substrate of the present example had a large size and high quality.

The example (Example 2) in which the etching time was changed and a comparative example illustrated by Table 1 will be described below. The single crystal growth conditions and evaluation items and conditions are identical to those of Example 1. The etching time and Raman evaluation results are shown in Table 4.

additional growth could be predicted by measuring the Raman shift quantity and distribution after the growth.

Finally, in the comparative example in which no etching was conducted prior to vapor phase growth, the substrate cracked after the first homoepitaxial growth. When the Raman shift distribution in the cracked substrate was measured, it was found that the surface area of strain regions A, C, peak deviation, and full width at half maximum of the peak were larger than those of Example 2 and the cracking threshold was exceeded in the first growth, thereby causing cracking.

TABLE 4

| | Etching time (h) | Etching thickness (μm) | Region | Raman shift after first growth | | | Region | Raman shift after second growth | | | Presence of cracks |
|---|---|---|---|---|---|---|---|---|---|---|---|
| | | | | Deviation of peak (cm$^{-1}$) | Region surface area proportion (%) | Full width half maximum (cm$^{-1}$) | | Deviation of peak (cm$^{-1}$) | Region surface area proportion (%) | Full width half maxmium (cm$^{-1}$) | |
| Example 1 | 1 | 0.6 | A | +0.5 to +0.8 | 0.5 | 2.1 to 2.6 | A' | +0.5 to +1.0 | 2.9 | 2.4 to 3.4 | No cracking |
| | | | B | −0.4 to +0.4 | 99.5 | 1.7 to 2.4 | B' | −0.5 to +0.4 | 97.1 | 2.0 to 2.5 | |
| | | | C | −0.4 to −0.3 | 0.3 | 2.0 to 2.4 | C' | −0.5 to −0.3 | 1.4 | 2.1 to 2.5 | |
| | | | D | −0.2 to +0.2 | 99.7 | 1.6 to 2.1 | D' | −0.2 to +0.2 | 98.6 | 1.7 to 2.2 | |
| Example 2 | 0.5 | 0.3 | A | +0.5 to +2.9 | 24 | 2.3 to 3.6 | A' | +0.5 to +3.7 | 27 | 2.4 to 3.8 | Cracking in second growth |
| | | | B | −1.0 to +0.4 | 76 | 2.1 to 2.6 | B' | −1.1 to +0.4 | 73 | 2.3 to 2.7 | |
| | | | C | −1.0 to −0.3 | 22 | 2.2 to 2.5 | C' | −1.1 to −0.3 | 26 | 2.4 to 2.6 | |
| | | | D | −0.2 to +0.2 | 78 | 2.0 to 2.2 | D' | −0.2 to +0.2 | 74 | 2.1 to 2.3 | |
| Example 3 | 10 | 60 | A | +0.5 to +0.7 | 0.09 | 1.9 to 2.5 | A' | +0.5 to +3.6 | 1.1 | 2.3 to 3.6 | Cracking in second growth |
| | | | B | −0.4 to +0.4 | 99.91 | 1.7 to 2.1 | B' | −1.1 to +0.4 | 98.9 | 2.2 to 2.6 | |
| | | | C | −0.4 to −0.3 | 0.08 | 2.0 to 2.2 | C' | −1.1 to −0.3 | 1.0 | 2.3 to 2.6 | |
| | | | D | −0.2 to +0.2 | 99.92 | 1.6 to 2.0 | D' | −0.2 to +0.2 | 99.0 | 2.2 to 2.3 | |
| Comparative Example | 0 | 0 | A | +0.5 to +3.6 | 26 | 2.5 to 3.6 | (Growth and measurements were impossible) | | | | Cracking in first growth |
| | | | B | −1.1 to +0.4 | 74 | 2.2 to 2.6 | | | | | |
| | | | C | −1.1 to −0.3 | 26 | 2.2 to 2.6 | | | | | |
| | | | D | −0.2 to +0.2 | 74 | 2.0 to 2.3 | | | | | |

Example 2 in Table 4 represents an example in which the etching thickness was small and etching time prior to vapor phase growth was short. In the first homoepitaxial growth, the regions A and C expanded with respect to those of the previous example, and the peak deviation and full width at half maximum of the peaks also increased, but a crack-free integrated body was obtained after the growth. However, it was found that after the subsequent second growth, cracking proceeded together with the seed crystal and the initial strains expanded causing cracking. When the Raman shift distribution was measured for the cracked substrate, it was found that the maximum peak deviation and strain regions A, C expanded with respect to those of the first growth and crystallinity degraded.

Example 3 represents an example in which the etching thickness was large and etching time prior to vapor phase growth was long. In the first homoepitaxial growth, by contrast with Example 2, the regions A, C became narrow and practically could not be observed. However, in the subsequent second growth, conversely, both the regions and the peak deviation were expanded which resulted in substrate cracking. Thus, it was found that initial strains, even when they are very small, create a problem from the standpoint of cracking prevention.

Based on those results it was found that the thickness allowing for crack-free homoepitaxial growth was limited by the difference in the initial etching thickness, and the threshold value of the strain quantity could be specified by the above-described Raman measurement method. Furthermore, conversely, the probability of cracking during subsequent Those results indicated that the diamond single crystal represented by Example 1 is a large, high-quality single crystal substrate that can be used for semiconductors and optical components.

What is claimed is:

1. A diamond single crystal substrate obtained by a vapor-phase growth method, wherein
    a diamond intrinsic Raman shift of the diamond single crystal substrate surface measured by microscopic Raman spectroscopy with a focused beam spot diameter of excitation light of 2 μm is deviated by +0.5 cm$^{-1}$ or more to +3.0 cm$^{-1}$ or less from the standard Raman shift quantity of strain-free diamond, in a region (region A) which is more than 0% to not more than 25%, in area, of the surface, and is deviated by −1.0 cm$^{-1}$ or more to less than +0.5 cm$^{-1}$ from the standard Raman shift quantity of strain-free diamond, in a region (region B) of the surface other than the region A.

2. The diamond single crystal substrate according to claim 1, wherein the surface area of said region A is from 0.1% or more to 10% or less of the surface.

3. The diamond single crystal substrate according to claim 1, wherein
    a full width at half maximum of a diamond intrinsic Raman peak in said region A is from 2.0 cm$^{-1}$ or more to 3.5 cm$^{-1}$ or less, and
    a full width at half maximum of a diamond intrinsic Raman peak in said region B is from 1.6 cm$^{-1}$ or more to 2.5 cm$^{-1}$ or less.

4. The diamond single crystal substrate according to claim 1, having a diameter of 10 mm or more.

5. A diamond single crystal substrate obtained by vapor-phase growth from a diamond single crystal seed substrate, wherein a diamond intrinsic Raman shift measured by setting the microfocus point on an interface of a seed substrate layer and a vapor-phase grown layer by the microscopic Raman spectroscopy with a focused beam spot diameter of excitation light of 2 μm is deviated by $-1.0$ cm$^{-1}$ or more to less than $-0.2$ cm$^{-1}$ from the standard Raman shift quantity of strain-free diamond, in a region (region C) which is more than 0% to not more than 25%, in area, of the interface, and is deviated by $-0.2$ cm$^{-1}$ or more to $+0.2$ cm$^{-1}$ or less from the standard Raman shift quantity of strain-free diamond, in a region (region D) of the interface other than the region C.

6. The diamond single crystal substrate according to claim 5, wherein the surface area of said region C is from 0.1% or more to 10% or less of the interface.

7. The diamond single crystal substrate according to claim 5, having a diameter of 10 mm or more.

8. The diamond single crystal substrate according to claim 5, obtained by vapor-phase growth from a diamond single crystal seed substrate, wherein said seed substrate is a diamond single crystal seed substrate whose surface has been etched away by reactive ion etching.

* * * * *